(12) United States Patent
Mende (10) Patent No.: US 11,635,452 B2
(45) Date of Patent: Apr. 25, 2023

(54) SYSTEMS, DEVICES, AND METHODS FOR MEASURING DIRECT CURRENT/LOW FREQUENCY SIGNAL COMPONENTS

(71) Applicant: Tektronix, Inc., Beaverton, OR (US)

(72) Inventor: Michael J. Mende, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/630,371

(22) PCT Filed: Jul. 13, 2018

(86) PCT No.: PCT/US2018/042134
§ 371 (c)(1),
(2) Date: Jan. 10, 2020

(87) PCT Pub. No.: WO2019/014622
PCT Pub. Date: Jan. 17, 2019

(65) Prior Publication Data
US 2020/0132731 A1  Apr. 30, 2020

Related U.S. Application Data

(60) Provisional application No. 62/532,765, filed on Jul. 14, 2017.

(51) Int. Cl.
*G01R 19/00*        (2006.01)
*G01R 15/12*        (2006.01)

(52) U.S. Cl.
CPC ....... *G01R 19/0015* (2013.01); *G01R 15/125* (2013.01)

(58) Field of Classification Search
CPC .... G01R 19/00; G01R 19/0015; G01R 15/12; G01R 15/125; G01R 1/067; G01R 1/06772; G01R 1/06766
See application file for complete search history.

(56) References Cited

U.S. PATENT DOCUMENTS 3,441,863 A    4/1969  Moriyasu
5,034,698 A *  7/1991  Moriyasu ............... H03F 3/505
                                                330/84
(Continued)

FOREIGN PATENT DOCUMENTS

CN    102062797 A    5/2011
CN    103884895 A    6/2014
(Continued)

OTHER PUBLICATIONS

International Search Report and Written Opinion of the International Searching Authority issued in International Application No. PCT/US2018/042134, dated Oct. 2, 2018.

*Primary Examiner* — Son T Le
(74) *Attorney, Agent, or Firm* — Miller Nash LLP; Andrew J. Harrington (57) ABSTRACT

A test and measurement probe system (100,104), including an input (106) to receive an input signal, the input signal including a low frequency (LF) and/or direct current (DC) component and an alternating current (AC) component, an extractor circuit (110), such as an AC coupling circuit or a LF and/or DC rejection circuit, configured to receive the input signal and to separate the AC component and the LF and/or DC component from the input signal, a first output (118) to output the alternating current component to the test and measurement instrument, and a second output to output the direct current component to the test and measurement instrument. In some embodiments, the LF and/or DC component is digitized prior to being output by the second output.

16 Claims, 10 Drawing Sheets

(56) References Cited

U.S. PATENT DOCUMENTS

| | | | |
|---|---|---|---|
| 8,497,696 B2 | 7/2013 | Reichel et al. | |
| 9,667,233 B2 | 5/2017 | Peschke | |
| 2006/0290357 A1 | 12/2006 | Campbell | |
| 2010/0277190 A1* | 11/2010 | Reichel | G01R 1/06766 324/754.11 |
| 2015/0054492 A1 | 2/2015 | Mende et al. | |
| 2018/0372779 A1* | 12/2018 | Peschke | G01R 13/22 |

FOREIGN PATENT DOCUMENTS

| | | | |
|---|---|---|---|
| DE | 102008009962 A1 | 6/2009 | |
| DE | 102015203651 A1 | 9/2016 | |
| JP | S46-24161 | 7/1971 | |
| JP | H06197019 | 7/1994 | |
| JP | 5432651 B2 * | 3/2014 | G01R 21/00 |

* cited by examiner

SYSTEMS, DEVICES, AND METHODS FOR MEASURING DIRECT CURRENT/LOW FREQUENCY SIGNAL COMPONENTS

PRIORITY

This application is a national stage filing under 35 U.S.C. § 371 of International Application No. PCT/US2018/042134, titled "Systems, Devices, and Methods for Measuring Direct Current/Low Frequency Signal Components," filed Jul. 13, 2018, which claims benefit of U.S. Provisional Application No. 62/532,765, titled "Systems, Devices, and Methods for Measuring DC/LF Signal Components when Using DC Reject, AC Coupling or an Isolated Input," filed on Jul. 14, 2017, which are incorporated herein by reference in their entirety.

FIELD OF THE INVENTION

This disclosure is directed to systems and methods related to test and measurement systems, and in particular, to a test and measurement probe system that outputs both an alternating current component and a direct current and/or low frequency component of an input signal.

BACKGROUND

Measuring low amplitude alternating current (AC) signals superimposed on a larger varying direct current (DC) offset component using a test and measurement instrument, such as an oscilloscope, usually requires the use of AC coupling or DC rejection to extract the AC signal and reject the DC or low frequency (LF) component. AC coupling or DC rejection may also be useful when using a probe with a test and measurement instrument, such as a spectrum analyzer that is typically AC coupled.

When using the AC coupling or DC rejection topology, the DC/LF component signal information is lost by being blocked or rejected. However, this information may be useful or needed in the overall analysis of a circuit's performance, for example, such as a power analysis. Using conventional test and measurement instruments, the DC/LF component signal information was lost, resulting in the test and measurement instrument's automatically-performed measurements not accurately representing the real input signal since the DC/LF component is not reflected in the automatically-performed measurements.

To remedy this, a user may manually adjust a probe offset control on the test and measurement instrument to null a static DC offset, which will be taken into account in the automatically-performed measurement. However, such a procedure is time consuming and may only work with a static DC/LF component—that is, it will not work for a dynamic DC/LF component. Further, adjusting the probe offset control is also limited to the test and measurement instrument's input offset range, which is usually limited in voltage, especially at the most sensitive vertical gain settings.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure measure and display both a DC/LF component of an input signal as well as a small amplitude AC component of the input signal. For ease of discussion, the DC and LF components of the input signal are discussed together. However, although the embodiments below discuss the DC/LF component, as will be understood by one skilled in the art, the DC/LF component may refer to a DC and/or LF component of an input signal. In some embodiments, as will be discussed in more detail below, this may be done by directly or indirectly digitizing the DC/LF component of the input signal and digitally communicating the DC/LF component of the input signal to the test and measurement instrument. Including the separated or previously blocked DC/LF component as part of the measurements and/or part of the displayed waveform of the AC component provides a user with valuable information that is conventionally not available on the test and measurement instrument.

In other embodiments, as will also be discussed in further detail below, the DC/LF component of the input signal may be routed to a terminal point that is configured to be connected to a test and measurement instrument channel or other input, such as a digital multimeter input on the test and measurement instrument. In such embodiments, the DC/LF portion of the signal may be buffered to allow a user to connect the signal to the channel or other input. Both these configurations allow a user to see on a display of the test and measurement instrument the small amplitude AC component of the input signal riding on top of a large DC/LF component of the input signal, as well as the larger DC/LF component of the input signal separately to better understand the operation of the circuit being tested.

Numerous test and measurement probe systems may be provided to perform the features of the embodiments discussed herein, such as seen in FIGS. 1-10. However, the embodiments discussed below are merely examples and the disclosure is not limited to only the example embodiments illustrated in FIGS. 1-10. The embodiments of the disclosure seamlessly provide information to a user in the user's measurement and analysis that the user does not have access to using conventional test and measurement probes.

FIGS. 1-10 may include additional electrical components not discussed below in the below discussed embodiments, such as additional capacitors, receivers, or other electrical components, as will be understood by one skilled in the art.

Figure 1:
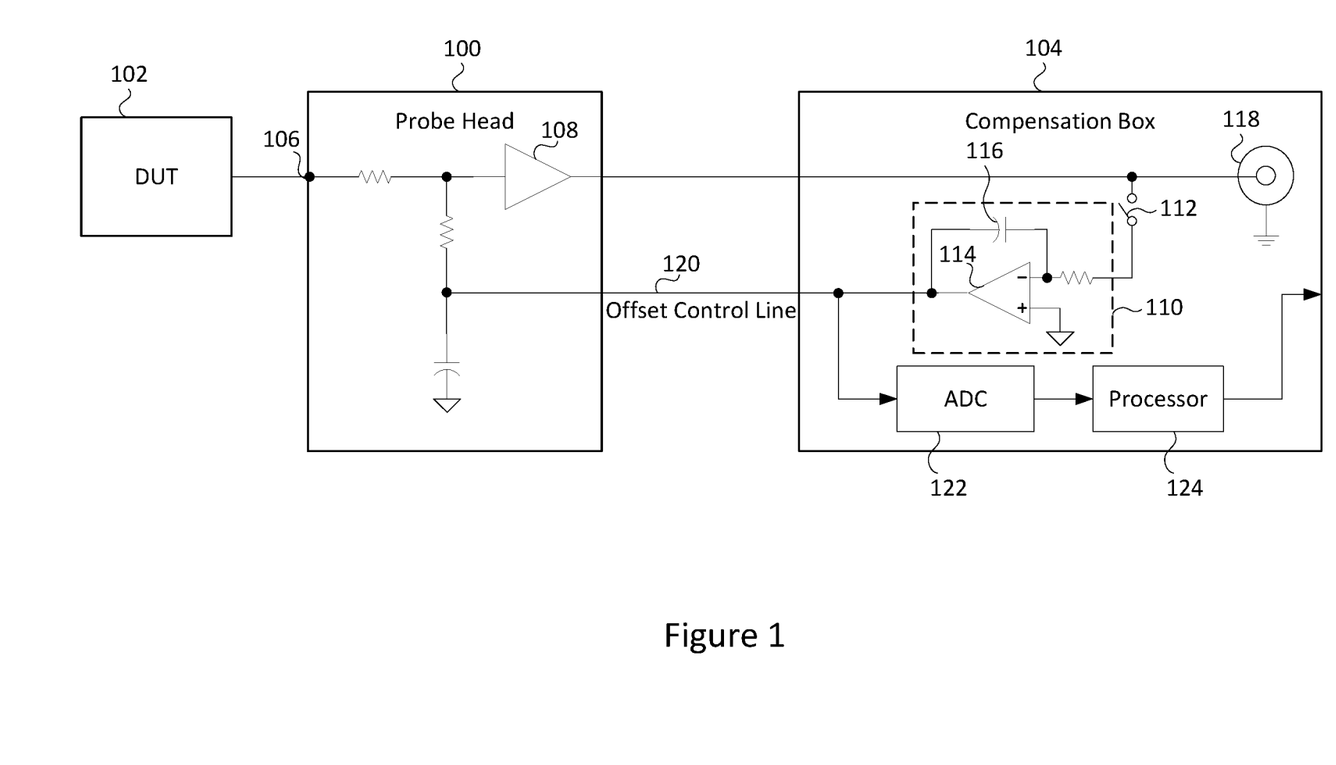
FIG. 1 is a block diagram of an example single-ended test and measurement probe system with a direct current (DC) rejection circuit according to some embodiments of the disclosure.

FIG. 1 is a block diagram illustrating an example test and measurement probe system according to some embodiments of the disclosure. FIG. 1 illustrates a probe head 100 connected to a device under test (DUT) 102. In FIG. 1, the probe head 100 is also connected to a compensation box 104. However, as will be understood by one skilled in the art, the compensation box 104 may be included within the probe head 100 rather than as a separate component, or may be omitted in entirety, while the components therein are included directly in the probe head 100.

In FIG. 1, the probe head 100 may include a single-ended probe input 106 to receive an input signal from the DUT 102. The probe head 100 may include an amplifier 108 to amplify the input signal. The compensation box 104 may include an extraction circuit 110 to extract the AC component and the DC/LF component from the input signal. In the example of FIG. 1, the extraction circuit 110 is a DC rejection circuit. The compensation box 104 also includes a DC rejection enable switch 112, which is closed when the extraction circuit 110, which will also be referred to herein as a DC rejection circuit with respect to FIG. 1, is enabled.

The DC rejection circuit 110 includes a differential amplifier 114 and a capacitor 116 to provide local feedback and stability to the DC rejection circuit 110 and outputs an inverted DC/LF component of the input signal. The inverse of the DC/LF component is transmitted to the probe head 100 through the offset control line 120 and is added to the input signal to remove the DC/LF component so that only the AC component is amplified through the amplifier 108 to an output 118, which may be connected to a channel of the test and measurement instrument.

The inverse of the DC/LF component may also be sent to an analog-to-digital converter (ADC) 122 which may be further processed by a processor 124, to reverse the inversion of the signal, for example, before being output to a communication interface (not shown) to the test and measurement instrument to digitally communicate the DC/LF component to the test and measurement instrument. As will be understood by one skilled in the art, the communication interface may be, for example, a wired or wireless communication mechanism, or any combination thereof, such as a universal serial bus (USB) or inter-integrated circuit (I2C) bus.

The test and measurement instrument may receive both the AC component and the DC/LF component separately, to include the DC/LF component as part of the measurements and/or part of the displayed waveform of the AC component, as discussed above.

FIGS. 2-10 provide various alternatives to the embodiment shown in FIG. 1. As such, only the differences between FIGS. 2-10 and FIG. 1 will be discussed and one of ordinary skill in the art will recognize that the features and advantages of FIG. 1 apply to each of the embodiments shown in FIGS. 2-10.

Figure 2:
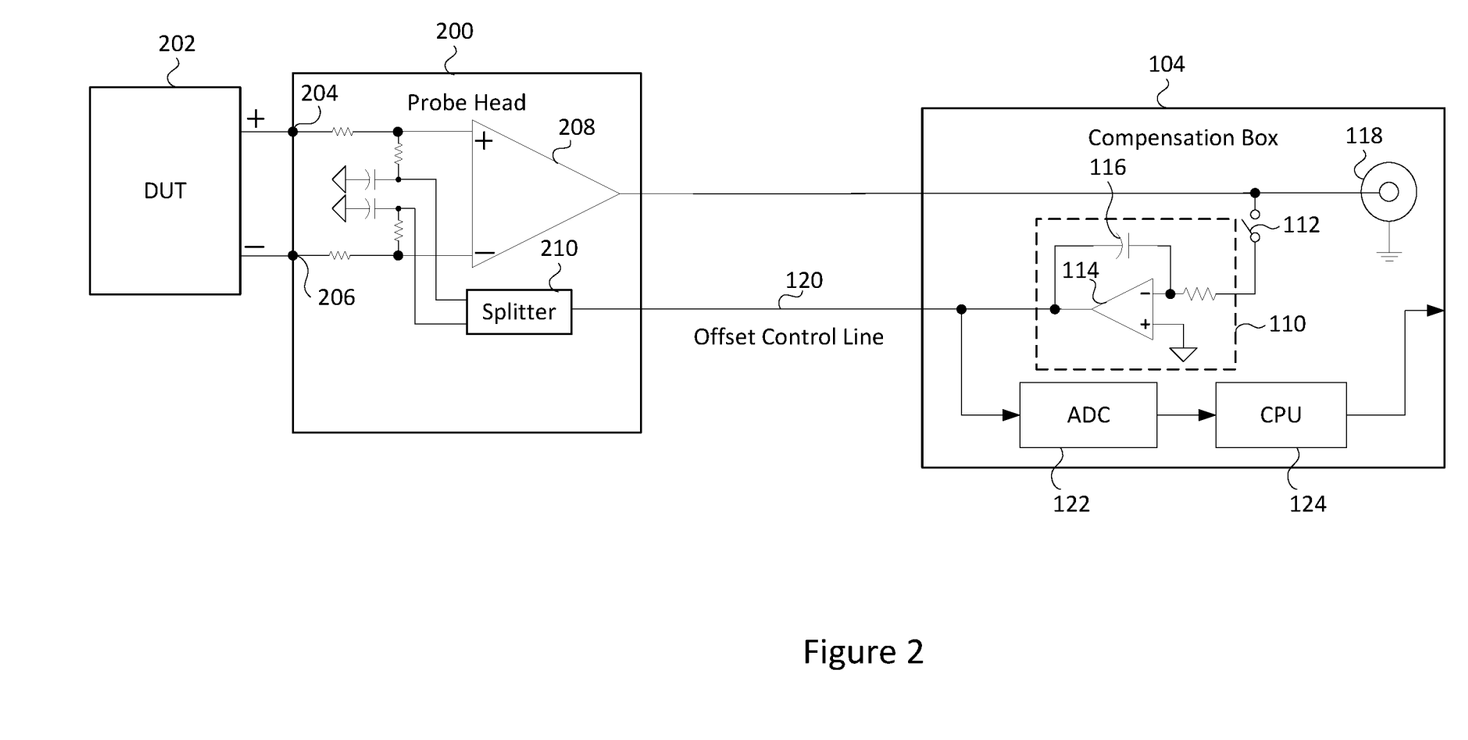
FIG. 2 is a block diagram of another example differential test and measurement probe system with a DC rejection circuit according to other embodiments of the disclosure.

FIG. 2 is a block diagram illustrating another example test and measurement probe system according to other embodiments of the disclosure. The probe system shown in FIG. 2 may include a compensation box 104 similar to the compensation box 104 of FIG. 1, and therefore like components are given the same reference numbers and not further described with respect to FIG. 2.

In FIG. 2, the probe head 200 may be a differential input probe head to receive a differential signal pair from a DUT 202. The probe head 200 includes a first input 204 to receive one of the differential signal pair from the DUT 202 and a second input 206 to receive the other of the differential signal pair from the DUT 202. A differential amplifier 208 receives the differential signal pair from the inputs 204 and 206 and outputs the difference between the differential signal pair to the output 118. The inverse of the DC/LF component is received in the probe 200 through offset control line 120 similar to probe 100 to remove the DC/LF component from the differential signal pair. A splitter 210, such as a differential splitter or amplifier that provides complementary analog signals, splits the DC/LF component on the offset control line 120 into two signals to be received at each of the inputs of the differential amplifier to remove the DC/LF component from the differential signal pair.

Figure 3:
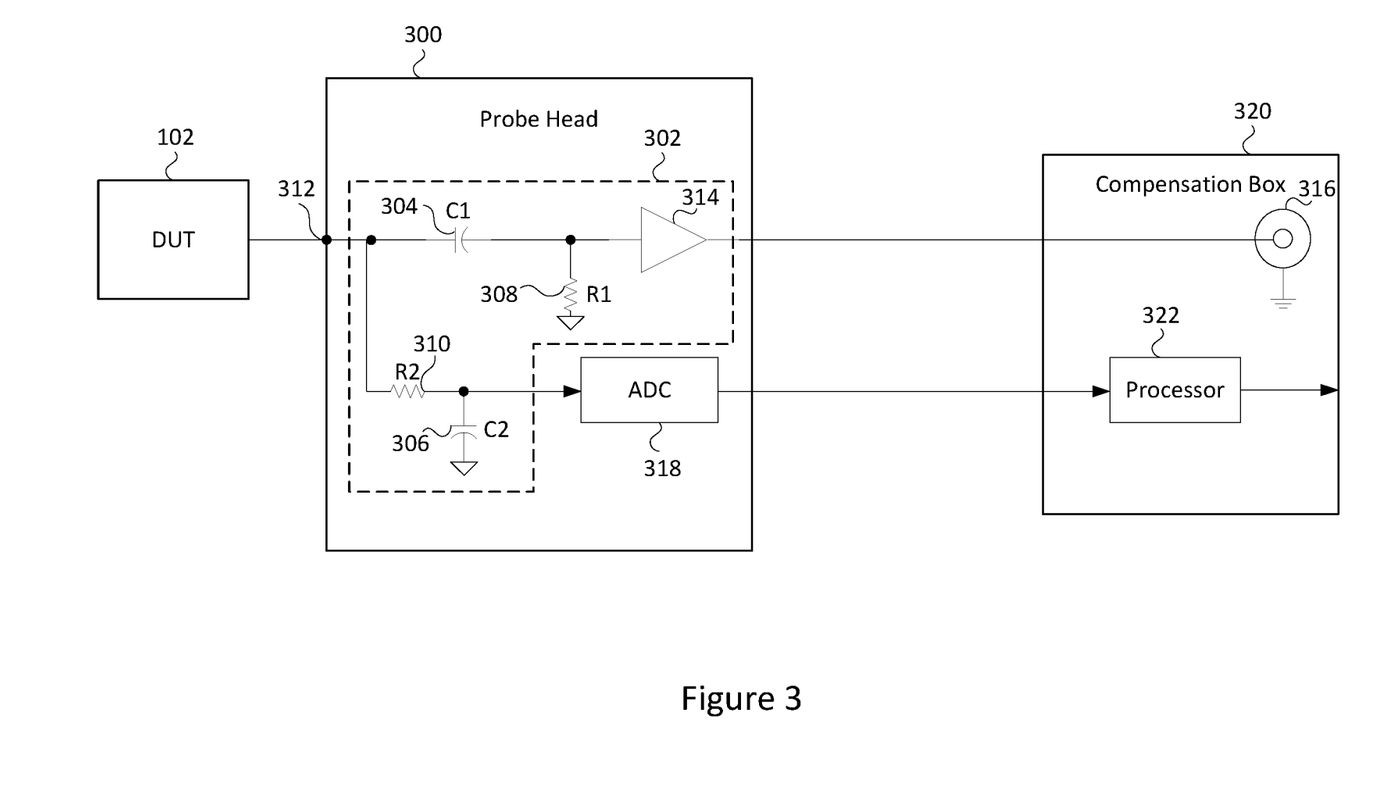
FIG. 3 is a block diagram of another example single-ended test and measurement probe system with an AC coupling circuit according to other embodiments of the disclosure.

While FIGS. 1 and 2 both illustrate the use of DC rejection circuits for the extraction circuit, such as the extraction circuit 110, in some embodiments, an AC coupling circuit may be used as the extraction circuit to separate the DC/LF component of the input signal. FIG. 3 is a block diagram illustrating another example test and measurement probe system that uses an AC coupling circuit 302 in probe head 300, rather than the DC rejection circuits discussed above. The extraction circuit 302 includes capacitors 304 and 306 and resistors 308 and 310. The input signal from input 312 is sent to capacitor 304, which only allows the AC component of the input signal to pass through the capacitor 304, which is sent through an amplifier 314 to an output 316, similar to output 118.

The AC component also passes through capacitor 306, leaving the DC/LF component to be digitized by an ADC 318. A compensation box 320 may include a processor 322 to further process the digitized DC/LF component before being output to a communication interface, similar to the test and measurement probe systems shown in FIGS. 1 and 2 and discussed above.

Since the low frequency cutoff for both AC coupling circuits 302 and DC rejection circuits 112 are typically less than 7 Hz, a low speed, greater than 8-bit ADC may be used in the various test and measurement probe systems discussed above that include an ADC, provided the ADC is calibrated to accurately make the measurement. However, increased precision and accuracy of the DC/LF component of the signal may be achieved by using a 10-, 12-, 14-, 16- or greater bit resolution ADC, and, as such, a higher resolution ADC may be desirable in some embodiments.

In all of the embodiments discussed above with ADCs, signal path scaling may need to be done to normalize the analog signal path to the digitized result of the DC/LF signal path, as would be understood by one skilled in the art.

In some embodiments, rather than digitizing the DC/LF component of the input signal in the compensation boxes 104 and 320, as shown in FIGS. 1-3, the analog DC/LF component of the input signal may be sent to the test and measurement instrument for display on a display of the test and measurement instrument. In these embodiments, a buffer may be used so that a user can connect a path that transmits the analog DC/LF component to a separate channel of the test and measurement instrument or to a digital multimeter input, as discussed in further detail below.

Figure 4:
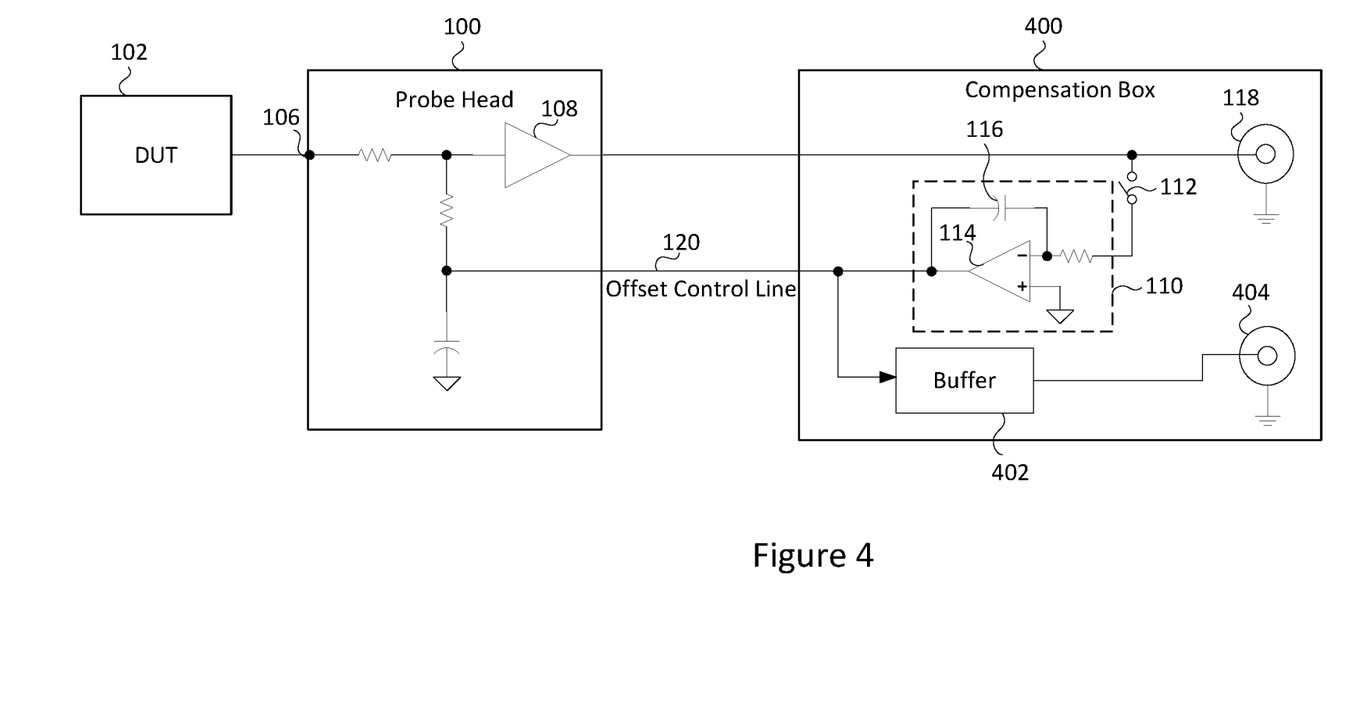
FIG. 4 is a block diagram of another example single-ended test and measurement probe system with a DC rejection circuit according to other embodiments of the disclosure.

For example, FIG. 4 is a block diagram illustrating a test and measurement probe system that is similar to the test and measurement probe system of FIG. 1. In fact, the probe head 100 in FIG. 4 is the same as the probe head 100 in FIG. 1 and therefore will not be discussed in further detail with respect to FIG. 4. Further, any like components are given the same reference numbers and are not discussed further with respect to FIG. 4.

The probe head 100 may be combined with a compensation box 400. In FIG. 4, rather than digitizing the DC/LF component through ADC 122 and transmitting the DC/LF component through a communication interface, the analog DC/LF component may be buffered in buffer 402 prior to being transmitted through output 404 to allow a user time to connect the path the DC/LF component is transmitted on to a separate channel of the test and measurement instrument or to a digital multimeter input of a test and measurement instrument. The test and measurement instrument may then further process the DC/LF component as will be understood by one skilled in the art.

Figure 5:
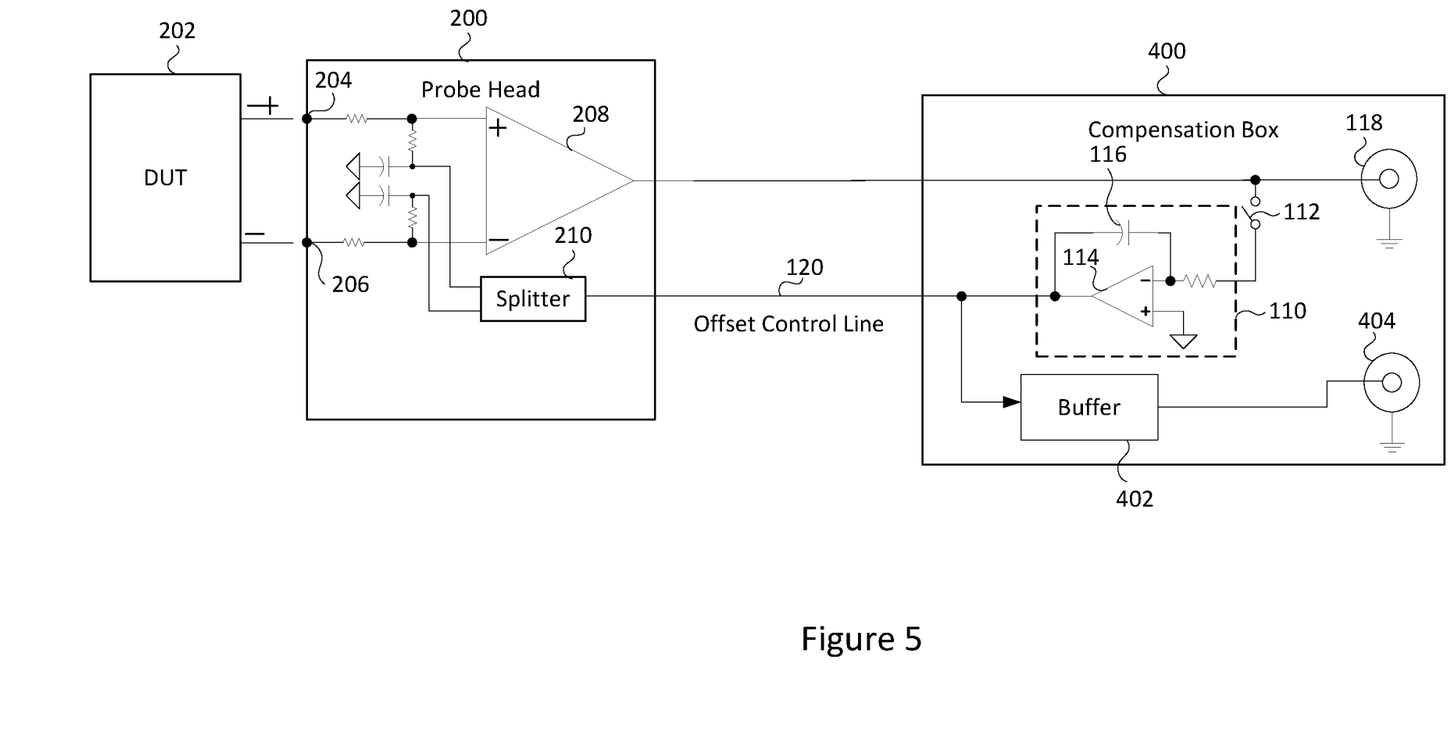
FIG. 5 is a block diagram of another example differential test and measurement probe system with a DC rejection circuit according to other embodiments of the disclosure.

FIG. 5 is similar to FIG. 4, except a differential input signal may be provided from DUT 202. That is, the probe head 200 may also be combined with the compensation box 400 so that the DC/LF component on the offset control line 120 may be buffered, rather than digitized, before being sent through output 404 to a separate channel of the test and measurement instrument.

Figure 6:
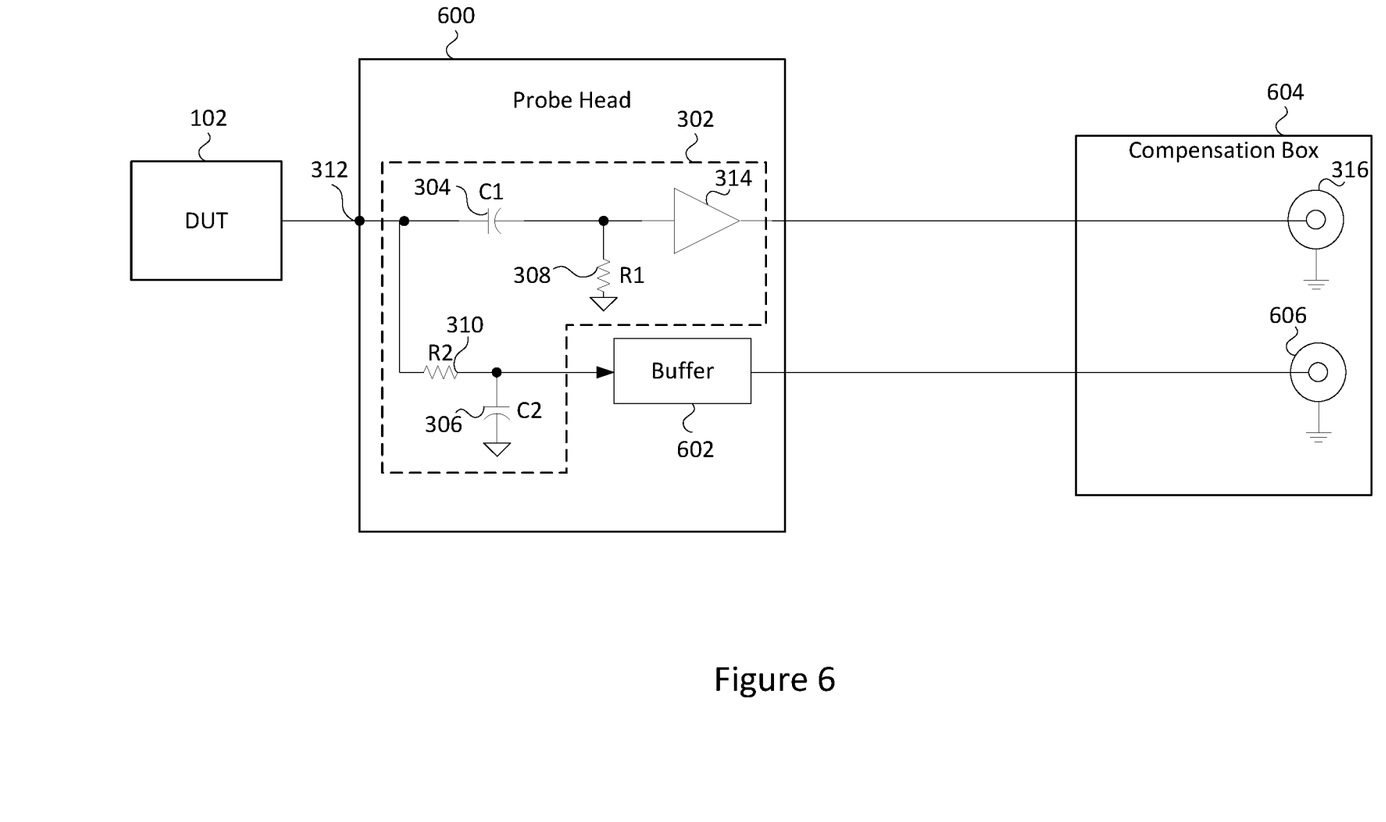
FIG. 6 is a block diagram of another example single-ended test and measurement probe system with an AC coupling circuit according to other embodiments of the disclosure.

Finally, the buffer may also be used when an AC coupling circuit 302 is used in the probe head, as shown in probe head 600 of FIG. 6. Probe head 600 is similar to probe head 300 and therefore like components are given the same reference numbers and are not discussed further herein with respect to FIG. 6. In probe head 600, rather than digitizing the DC/LF component, as was done in probe head 300, the DC/LF component may be sent to buffer 602, similar to FIGS. 4 and 5. Compensation box 604 is connected to probe head 600 and may include output 316 as well as output 606 to transmit the analog DC/LF component to the test and measurement instrument.

In the various embodiments discussed above, an AC coupling circuit 302 can include matching of the input signal's DC/LF component pole (R1C1) with the DC/LF digitized signal path's high frequency pole (R2C2).

In some embodiments, as seen in FIGS. 7-10, an isolated test and measurement probe system may be implemented. Isolating the DC/LF component may result in lower noise and lower cost than previous conventional isolated structures. The embodiments shown in FIGS. 7-10 are similar to some embodiments discussed above.

Figure 7:
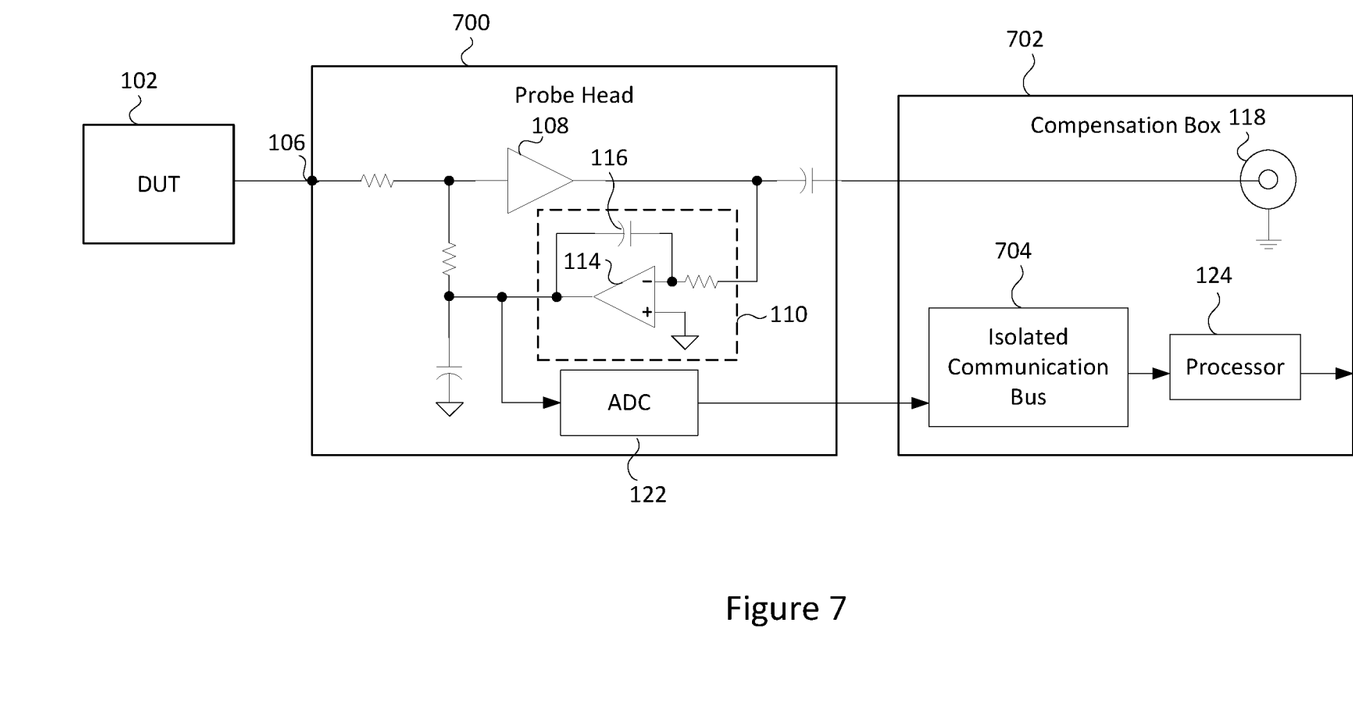
FIG. 7 is a block diagram of an example single-ended isolated test and measurement probe system with a DC rejection circuit according to other embodiments of the disclosure.

FIG. 7 is a block diagram illustrating an isolated test and measurement probe system including a probe head 700 that includes the DC rejection circuit 110 and ADC 122. That is, probe head 700 combines many of the components of probe head 100 and compensation box 104 of FIG. 1 into a single probe head 700. As such, like components are given like reference numbers and are not discussed in detail with respect to FIG. 7. The probe head 700 is connected to a compensation box 702 which may include an isolated communication bus 704. The digitized DC/LF component may be sent to the isolated communication bus 704. The output from the isolated communication bus 704 may be further processed in processor 124, and then output to a communication interface, similar to FIG. 1. As will be understood by one skilled in the art, a similar compensation box 704 may be used with a differential probe head, similar to FIG. 2, but that includes the DC rejection circuit and ADC like FIG. 1.

Figure 8:
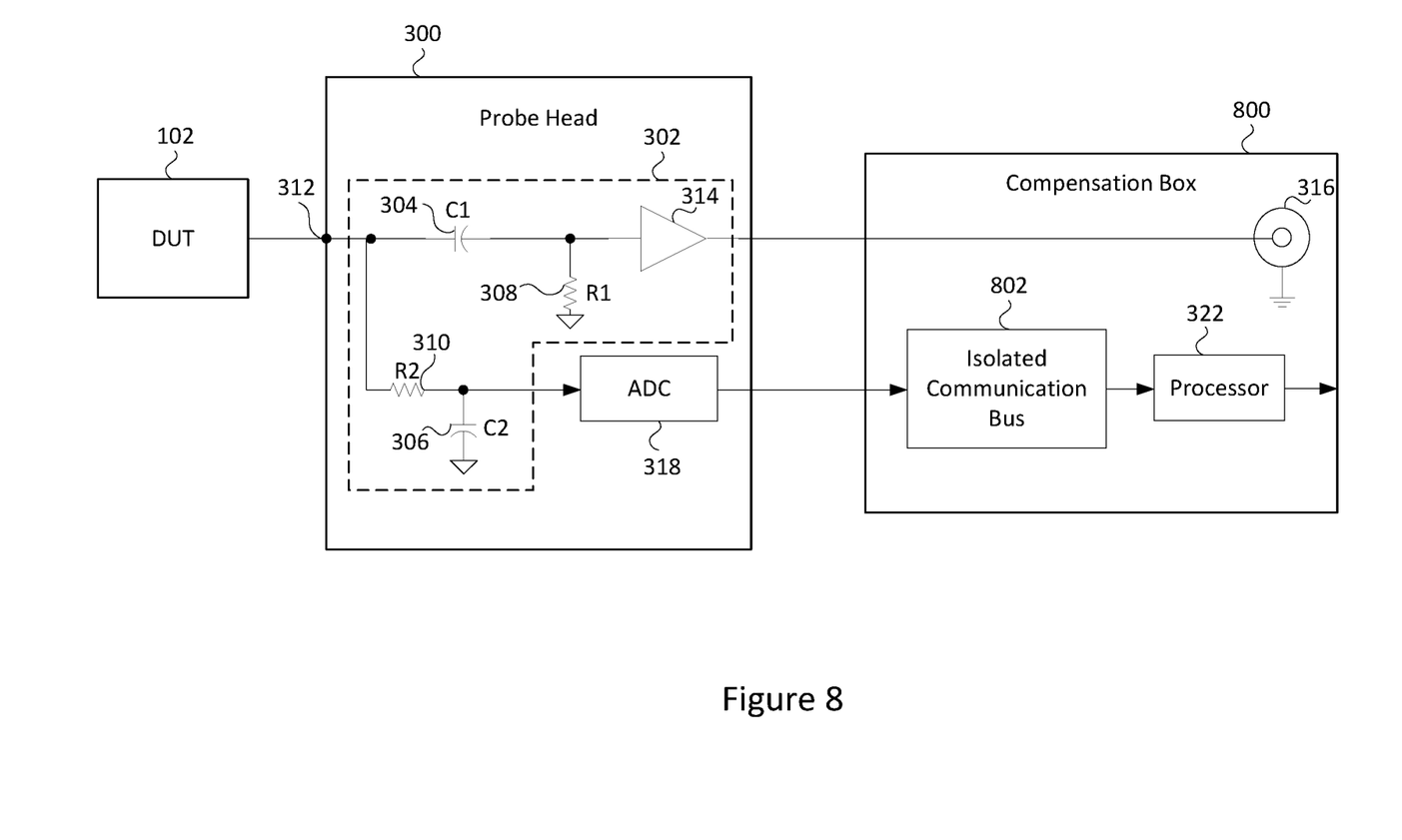
FIG. 8 is a block diagram of another example single-ended isolated test and measurement probe system with an AC coupling circuit according to other embodiments of the disclosure.

The isolated output may also be utilized with an AC coupling circuit 302, as illustrated in FIG. 8. In the isolated test and measurement probe system of FIG. 8, probe head 300, discussed above with respect to FIG. 3 is connected to a compensation box 800 that includes an isolated communication bus 802 to receive the digitized DC/LF component from ADC 318, similar to that discussed above with respect to FIG. 7. That is, the isolated test and measurement probe system of FIG. 8 is similar in operation to the test and measurement probe system shown in FIG. 3, except an isolated output is provided.

Figure 9:
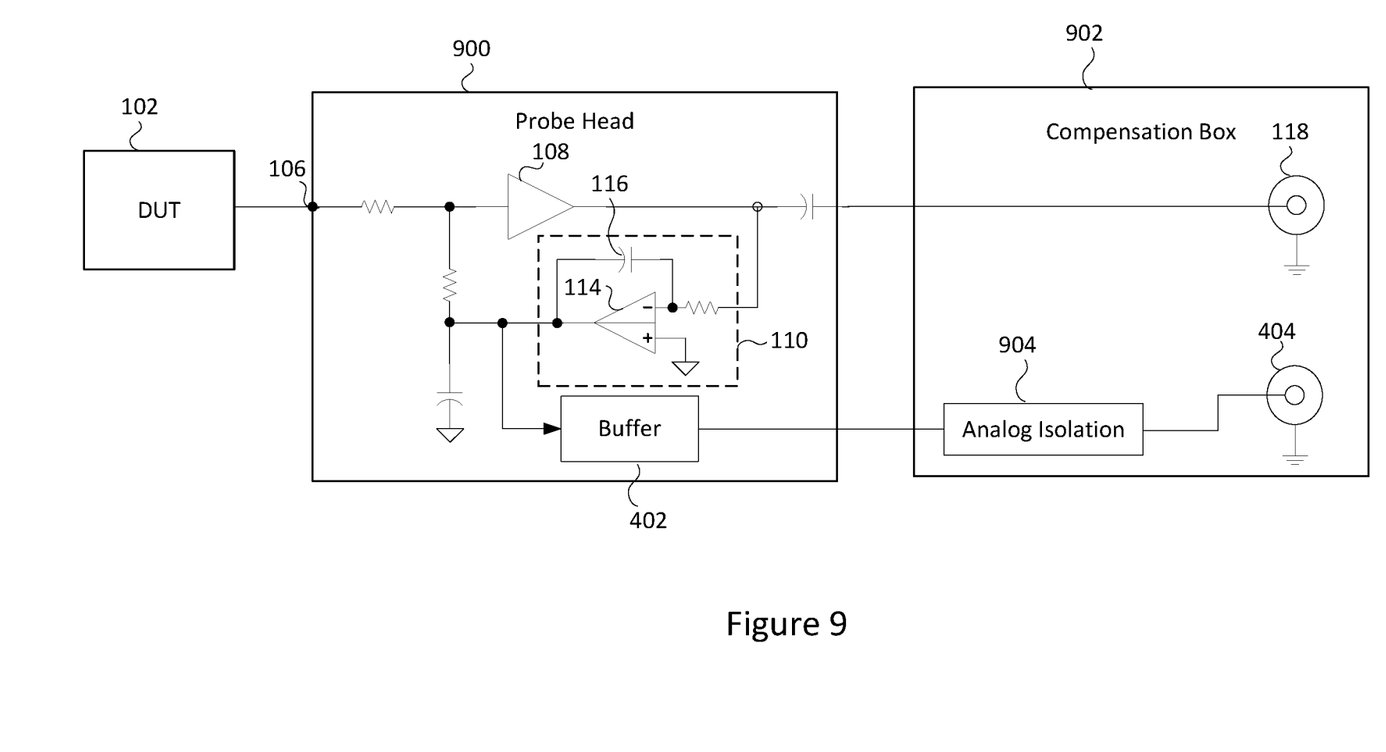
FIG. 9 is a block diagram of an example single-ended isolated test and measurement probe system with a DC rejection circuit according to other embodiments of the disclosure.
Figure 10:
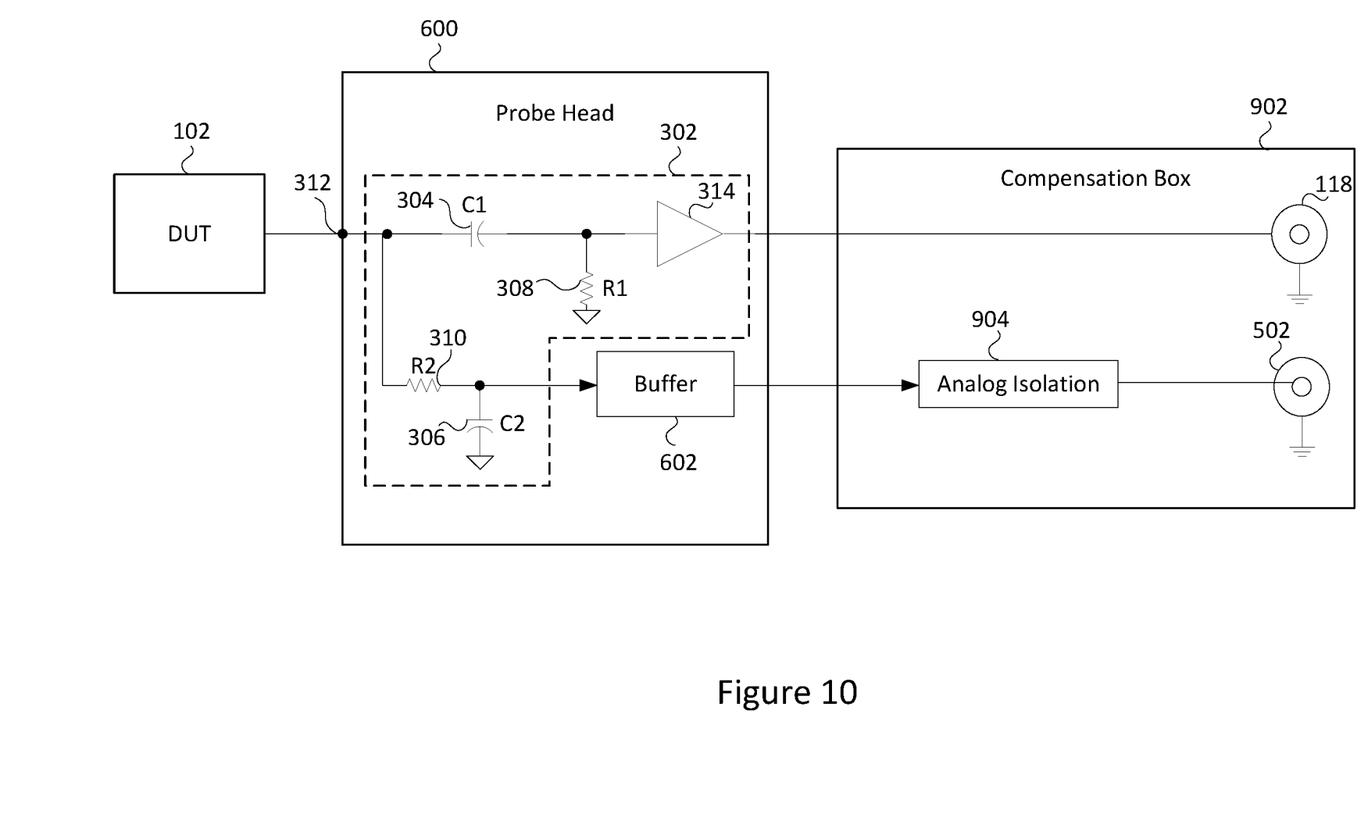
FIG. 10 is a block diagram of another example single-ended isolated test and measurement probe system with an AC coupling circuit according to other embodiments of the disclosure.

The isolated test and measurement probe systems are also not limited to digitized DC/LF components, as shown in FIGS. 9 and 10. The isolated test and measurement probe systems may also include outputting an isolated analog DC/LF component, as shown in FIGS. 9 and 10.

Probe head 900 in FIG. 9 includes the DC rejection circuit 110 and buffer 402. The DC/LF component is sent from the buffer 402 to an analog isolation 904 in compensation box 902 before being output to output 504. That is, the isolated test and measurement probe system of FIG. 9 is similar in operation to the test and measurement probe system shown in FIG. 5, except an isolated output is provided. Similar to FIG. 7, a similar type of isolated test and measurement probe system may be used with a differential input, using the differential amplifier 208.

FIG. 10 illustrates another isolated test and measurement probe system with the DC/LF component not digitized by the probe head 600. That is, the probe head 600 of FIG. 6 may be combined with the compensation box 902 of FIG. 9 to output an isolated DC/LF component to the test and measurement instrument.

As will be understood by one skilled in the art and discussed above with various embodiments, the different probe heads and compensation boxes may be connected in a variety of combinations depending on the type of input signal received, such as a single input signal or a differential signal pair, and the desired extraction circuit and/or output time. However, each of the embodiments includes separating the input signal into its DC/LF component and AC component, and outputting each of the components separately to the test and measurement instrument. This allows the test and measurement system to seamlessly analyze the AC component and display more information to a user than was previously available using conventional AC coupling or DC rejection circuits.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below. Example 1 is a test and measurement probe system, comprising an input to receive an input signal, the input signal including a direct current (DC) component and an alternating current (AC) component; an extractor circuit configured to receive the input signal and to separate the AC component and the DC component from the input signal; a first output to output the AC component to the test and measurement instrument; and a second output to output the DC component to the test and measurement instrument.

Example 2 is the test and measurement probe system of example 1, further comprising an analog-to-digital converter to receive the DC component and convert the DC component to a digitized DC component, wherein the second output is configured to output the digitized DC component.

Example 3 is the test and measurement probe system of either one of examples 1 or 2, further comprising a buffer, the buffer configured to receive the DC component and output the DC component through the second output.

Example 4 is the test and measurement probe system of any one of examples 1-3, wherein the extractor circuit is a DC rejection circuit configured to receive the input signal and output the DC component.

Example 5 is the test and measurement probe system of example 4, wherein the DC component is a feedback signal which is fed back to the input signal to separate the AC component.

Example 6 is the test and measurement probe system of any one of examples 1-3, wherein the extractor circuit includes an AC coupling circuit.

Example 7 is the test and measurement probe system of any one of examples 1-6, wherein the input signal includes a differential signal.

Example 8 is the test and measurement probe system of any one of examples 1-7, wherein the first output is connected to a first channel of the test and measurement instrument and the second output is connected to a second channel of the test and measurement instrument different from the first channel.

Example 9 is the test and measurement probe system of any one of examples 1-8, further comprising an isolation device to receive the DC component and output an isolated DC component to the second output.

Example 10 is the test and measurement probe system of any one of examples 1-9, wherein the second output is connected to a digital multimeter input of the test and measurement instrument.

Example 11 is a method, comprising receiving an input signal, the input signal including a low frequency (LF) component and an alternating current (AC) component; extracting the LF component from the input signal; extracting the AC component from the input signal; transmitting the AC component to a test and measurement instrument through a first output; and transmitting the LF component to the test and measurement instrument through a second output.

Example 12 is the method of example 11, further comprising converting the LF component to a digitized LF component, wherein transmitting the LF component includes transmitting the digitized LF component.

Example 13 is the method of either one of examples 11 or 12, further comprising transmitting the LF component to a digital multimeter input of the test and measurement instrument.

Example 14 is the method of any one of examples 1-13, further comprising buffering the LF component to delay the transmission of the LF component through the second output.

Example 15 is the method of any one of examples 11-14, wherein extracting the LF component from the input signal and extracting the AC component from the input signal includes extracting the LF component and the AC component through a direct current rejection circuit by adding the LF component to the input signal to extract the AC component.

Example 16 is the method of any one of examples 11-15, wherein extracting the LF component from the input signal and extracting the AC component from the input signal includes extracting the LF component and the AC component through an AC coupling circuit.

Example 17 is the method of any one of examples 11-16, wherein the second output is a communication interface.

Example 18 is the method of any one of examples 11-17, wherein transmitting the AC component to the test and measurement instrument through the first output includes transmitting the AC component to a first channel of a test and measurement instrument, and wherein transmitting the LF component to the test and measurement instrument through a second output includes transmitting the LF component to a second channel of the test and measurement instrument different from the first channel.

Example 19 is the method of any one of examples 11-18, further comprising isolating the LF component prior to transmitting the LF component.

Example 20 is the method of any one of examples 11-19, further comprising displaying the AC component and the LF component of the input signal simultaneously. The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement probe structured to couple to a test and measurement instrument, comprising:
   an input to the probe to receive a single input signal, the single input signal including a direct current (DC) component and an alternating current (AC) component;
   an extractor circuit in the probe having an input configured to receive the single input signal and configured to separate the AC component and the DC component from the single input signal;
   a first output to output the AC component to the test and measurement instrument;
   a second output to output the DC component to the test and measurement instrument;
   a first feedback loop within the probe configured to connect an output of the extractor circuit to the input of the extractor circuit; and
   a second feedback loop within the probe coupled between the output of the extractor circuit and the input signal, the second feedback loop structured to add an inverse of the DC component extracted from the input signal back to the input signal.

2. The test and measurement probe of claim 1, further comprising an analog-to-digital converter to receive the DC component and convert the DC component to a digitized DC component, wherein the second output is configured to output the digitized DC component.

3. The test and measurement probe of claim 1, further comprising a buffer, the buffer configured to receive the DC component and output the DC component through the second output.

4. The test and measurement probe of claim 1, wherein the extractor circuit is a DC rejection circuit configured to receive the input signal and output the DC component.

5. The test and measurement probe of claim 1, wherein the input signal includes a differential signal.

6. The test and measurement probe of claim 1, wherein the first output is connected to a first channel of the test and measurement instrument and the second output is connected to a second channel of the test and measurement instrument different from the first channel.

7. The test and measurement probe system of claim 6, further comprising an isolation device separate from the probe to receive the DC component and output an isolated DC component to the second output.

8. The test and measurement probe of claim 1, wherein the second output is connected to a digital multimeter input of the test and measurement instrument.

9. A method, comprising:
   receiving a single input signal at a probe head, the single input signal including a low frequency (LF) component and an alternating current (AC) component;
   extracting the LF component from the input signal in the probe head in an extractor circuit;
   transmitting the AC component to a test and measurement instrument through a first output;
   feeding back an inverse of the LF component from an output of the extractor circuit to an input of the extractor circuit;
   additionally feeding back an inverse of the LF component from the output of the extractor to the single input signal;
   and
   transmitting the LF component to the test and measurement instrument through a second output.

10. The method of claim 9, further comprising converting the LF component to a digitized LF component in the probe head, wherein transmitting the LF component includes transmitting the digitized LF component.

11. The method of claim 9, further comprising transmitting the LF component to a digital multimeter input of the test and measurement instrument.

12. The method of claim 9, further comprising buffering the LF component to delay the transmission of the LF component through the second output.

13. The method of claim 9, wherein the second output is a communication interface.

14. The method of claim 9, wherein transmitting the AC component to the test and measurement instrument through the first output includes transmitting the AC component to a first channel of the test and measurement instrument; and
   wherein transmitting the LF component to the test and measurement instrument through a second output includes transmitting the LF component to a second channel of the test and measurement instrument different from the first channel.

15. The method of claim 9, further comprising isolating the LF component prior to transmitting the LF component.

16. The method of claim 9, further comprising displaying the AC component and the LF component of the input signal simultaneously.

* * * * *